United States Patent [19]

de Concini et al.

[11] Patent Number: 4,766,869
[45] Date of Patent: Aug. 30, 1988

[54] HOUSING SYSTEM FOR A CENTRAL ELECTRONIC PROCESSING UNIT OF A HEAT ENGINE

[75] Inventors: Roberto de Concini, Via Belvedere; Gianni Fargnoli, Via Goldoni, both of Italy

[73] Assignee: Weber S.r.l., Turin, Italy

[21] Appl. No.: 41,148

[22] Filed: Apr. 22, 1987

[30] Foreign Application Priority Data

Apr. 22, 1986 [IT] Italy ................................ 67336 A/86

[51] Int. Cl.[4] ............................................. F01P 1/06
[52] U.S. Cl. ................................ 123/478; 123/198 E; 123/647
[58] Field of Search ............ 123/198 R, 198 E, 41.31, 123/470, 472, 478, 647

[56] References Cited

U.S. PATENT DOCUMENTS

| 3,785,354 | 1/1974 | Moulds ................................ 123/478 |
| 3,996,914 | 12/1976 | Crall et al. ................... 123/198 R X |
| 4,557,225 | 12/1985 | Sagues et al. ..................... 123/480 X |

FOREIGN PATENT DOCUMENTS 36767  2/1985  Japan ................................ 123/494

Primary Examiner—Tony M. Argenbright
Attorney, Agent, or Firm—Gifford, Groh, VanOphem, Sheridan, Sprinkle and Dolgorukov

[57] ABSTRACT

A housing system for a central electronic processing unit of a heat engine, including a first part connected with heat-developing component elements of the processing unit, this first part contacting over at least a substantial part of its surface, an outer surface of a portion of a fuel mixture induction manifold of the engine.

16 Claims, 3 Drawing Sheets

HOUSING SYSTEM FOR A CENTRAL ELECTRONIC PROCESSING UNIT OF A HEAT ENGINE

BACKGROUND OF THE INVENTION

The present invention relates to a housing system for a central electronic processing unit for a heat engine, in particular a central electronic processing unit for an injection and/or ignition system for a heat engine of a motor vehicle.

As is known, in such electronic processors there exists the problem of dissipating the heat developed substantially by the power elements of the processor itself. Various housing and fixing arrangements are therefore adopted using additional cooling bodies with cooling fins etc.

SUMMARY OF THE INVENTION

The object of the present invention is that of providing a housing system for a central electronic processing unit for a heat engine which will be of high efficiency and relatively simple and economic manufacture.

According to the present invention there is provided a housing system for a central electronic processing unit for a heat engine, characterized by the fact that it includes a first part in thermal contact with heat-developing component elements of the said processing unit, the said first part being on contact over at least a substantial part of its surface with an outer surface of a portion of a fuel mixture induction manifold of the said engine.

BRIEF DESCRIPTION OF THE DRAWINGS

For a better understanding of the present invention a particular embodiment will now be described, purely by way of non-limitative example, with reference to the attached drawings, in which.

DETAILED DESCRIPTION OF THE INVENTION

Figure 1:
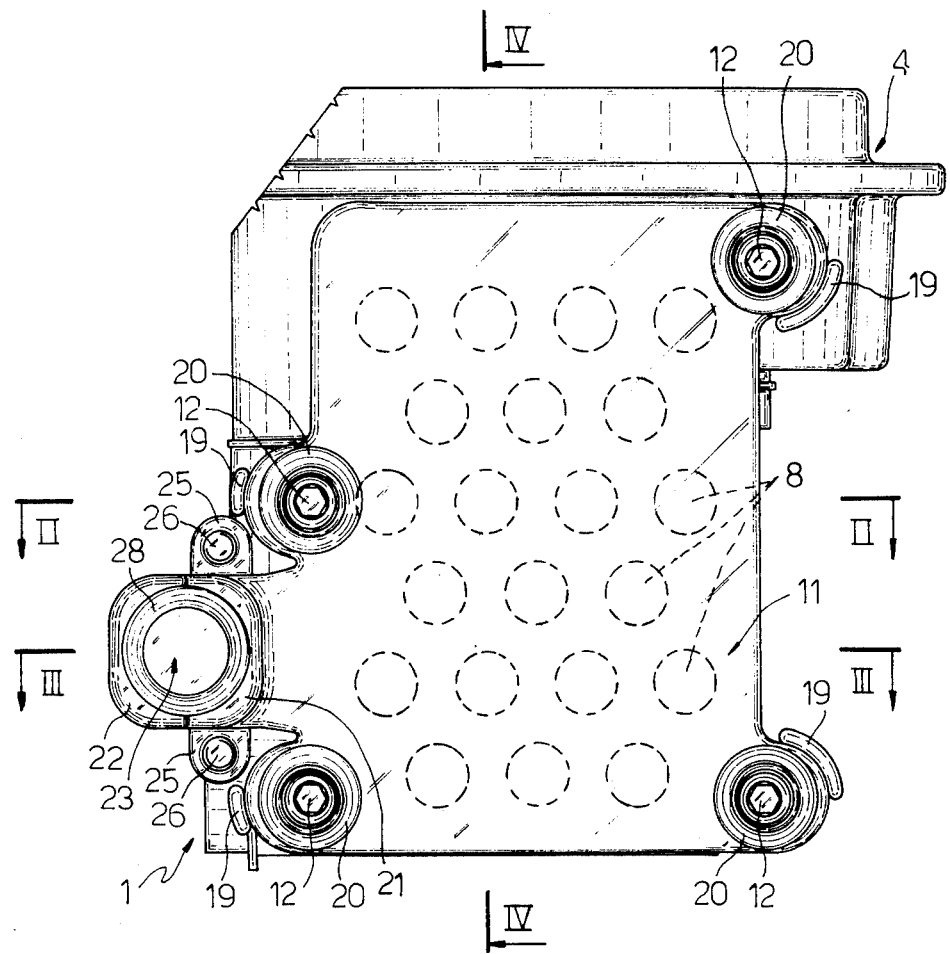
FIG. 1 is a front view of a central electronic processing unit for a heat engine, housed according to the arrangement of the present invention.

With reference to Figures from 1 to 4, the reference numeral 1 indicates a die-cast body having a convenient form with an internal duct 2 passing therethrough, which constitutes a section of the fuel mixture induction manifold (the mixture conveniently being air and petrol) for a heat engine, conveniently in this duct 2 there is disposed a butterfly valve 3 of known type for regulating the quantity of fuel mixture inducted. Above the body 1 is fixed a body 4 having an internal duct 5 passing therethrough coaxial with the duct 2 and housing the various elements (of known type and not illustrated) for the injection of fuel into the induction manifold. The body 1 then has a lateral portion 6 which defines an external flat surface 7 parallel to the axis of the duct 2; in this portion 6, perpendicular to the surface 7 are formed a plurality of blind holes 8 having a cross-section decreasing towards the interior, the taper being substantially necessary for correct moulding of the portion 6 itself which is integral with the body 1. Perimetrically of the portion 6 is housed a seal 9 against which lies the edge 10 of a cover 11 which is fixed by means of screws 12; in particular, within the cover 11, there are disposed coil springs 13 on the screws 12, which press a metal plate 14 contained in the perimeter of the cover 11 into contact with the surface 7 of the portion 6 of the body 1. On this plate 14 is fixed a printed circuit board 15 which carries the component elements 16 of a cental electronic processing unit, conveniently a known central electronic processing unit for an injection and/or ignition system for the heat engine of a motor vehicle. The plate 14 is prevented from becoming unscrewed from the screws 12 by means of retaining bushes 17, conveniently of plastics material, screwed on the terminal threaded portions of the screws 12 which are screwed into holes 18 in the portion 6. This portion 6 further has external projections 19 perpendicular to the surface 7 for centering the cover 11 in correspondence with housing portions 20 for the screws 12. During possible dismantling of the cover 11 the screws 12 are prevented from coming undone by the existence of the retaining bushes 17 which, given a certain depth of the housing in which they are disposed in the portion 6, have a free displacement relative to the screws 12 for this limited depth in such a way that they also prevent casual or erroneous dismantling of the central electronic processing unit from the elements which support and/or contain it.

Towards a lateral zone the cover 11 has a portion 21 folded outwardly and defining a half-shell which can be closed with another half-shell 22 which, together with the portion 21, defines an interior space 23 through which pass electrical cables 24 for the electrical connection of the electrical circuit component elements 16 of the central processing unit and the external circuit elements; in particular, this portion 21 has lateral projections 25 with threaded holes in which engage the threaded ends of screws 26 passing through the holes of projections 27 formed in the sides of the half-shell 22 for securing this to the portion 21.

Figure 3:
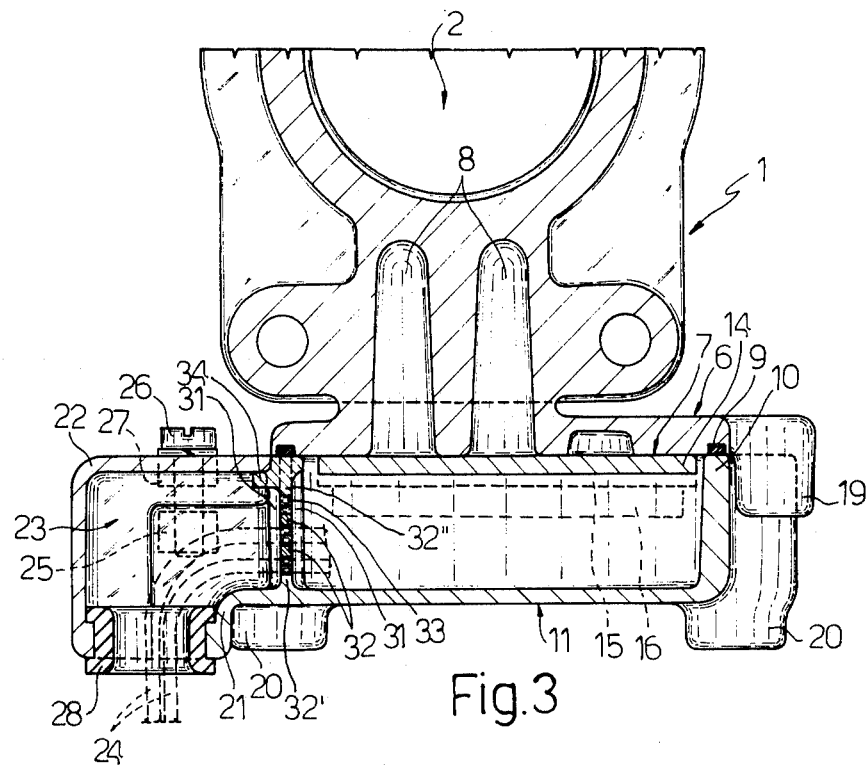
FIGS. 2, 3 and 4 are sectioned views taken on the lines II—II, III—III and IV—IV respectively of the central electronic processing unit of FIG. 1.
Figure 2:
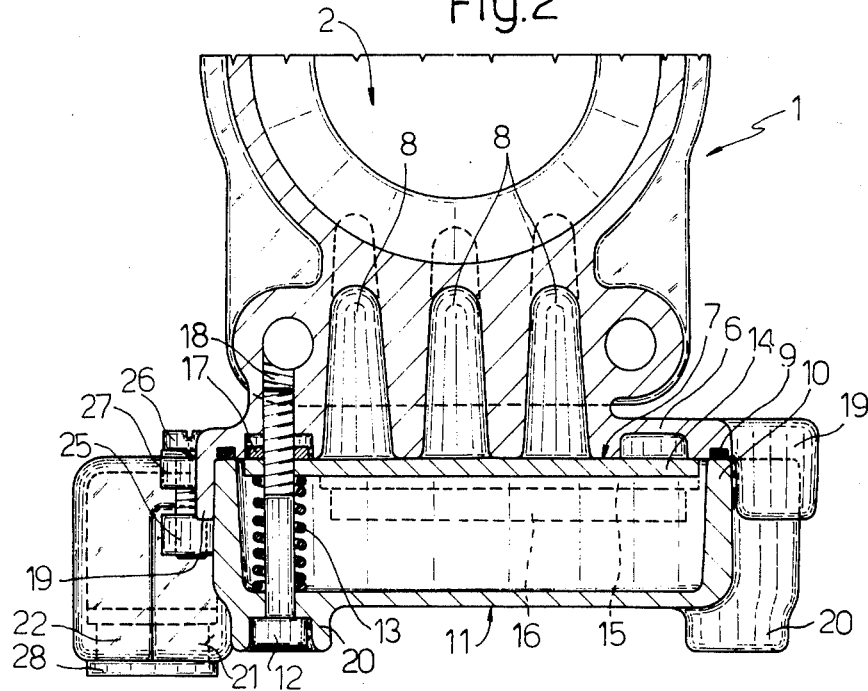
Figure 4:
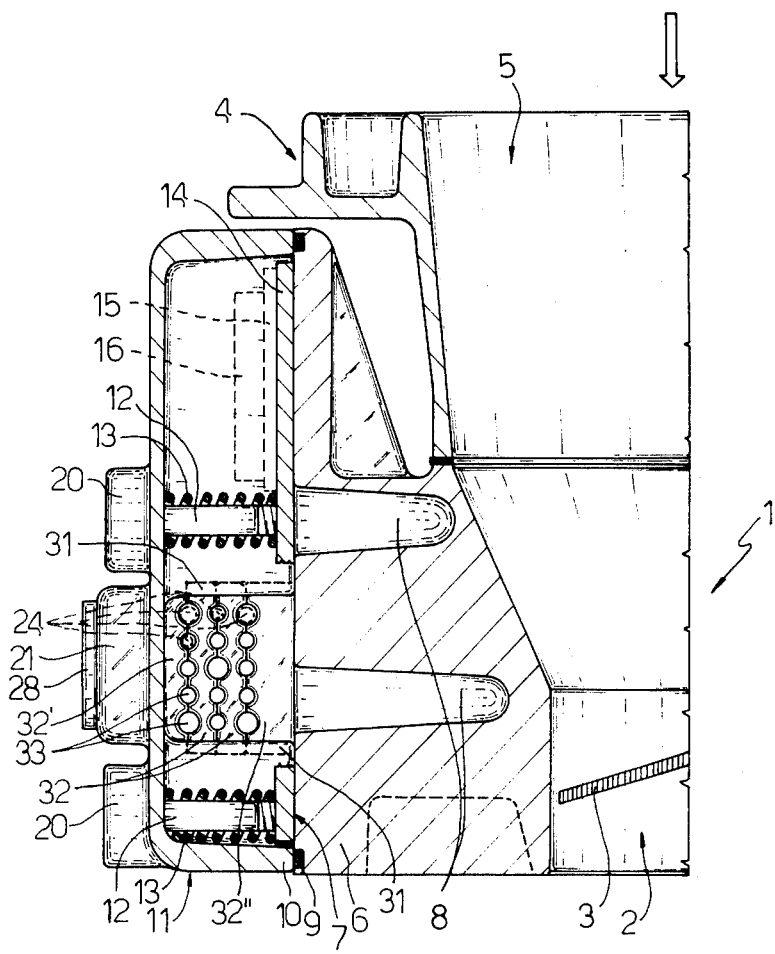

The terminal edges of the portion 21 and the half-shell house an inner bush 28 for definition of the hole through which the cables 24 pass. The cover 11, in correspondence with the beginning of the portion 21, has two pairs of inner walls 31 which constitute two guide slots for the insertion and housing of the ends of combs 32 which are disposed one above the other in alignment in the plane of these slots and have semi-circular cavities in the edges such as to define in combination through holes 33 which constitute ordered passages for the electrical cables 24 (FIGS. 3 and 4). In particular, the comb nearest the base of the cover 11, indicated 32', is integral with the cover 11 itself, whilst the outermost comb at the opposite end, indicated 32'', has a lateral projection 34 on which rests an edge of the half-shell 22 which, with the closure of the screws 26, also causes mutual closure of the various combs 32. The combs 32' and 32'' naturally have semi-circular cavities formed only in the edge facing the adjacent combs 32.

The assembly of the central electronic processor housing systems described takes place as follows. After the component elements 16 of the central processor with the printed circuit board 15 are disposed on the metal plate 14 this latter is housed in the cover 11 and fixed on the screws 12 by means of the bushes 17; the various electrical connection cables 24 are then disposed in an ordered manner in the holes 33 defined by the various combs 32', 32 and 32'' and the assembly of these combs is then fixed by means of the half-shell 22 and the interior chamber 23 can conveniently be filled with resin to seal the cables 24. The assembly comprising the cover 11 and the housing elements just described can then be fixed with the metal plate 14 resting on the outer surface 7 of the portion 6 of the body 1 and secured by means of the screws 12 in the holes 18.

It is further possible to fill the circular ring defined by the exterior of the heads of the screws 12 and the associated housing 20 in which the screws 12 are disposed with resin, and in this way form a complete seal for the interior of the cover 11. Alternatively, sealing washers can be disposed under the heads of the screws 12.

Heat developed by the component elements 16 of the central processing unit during operation thereof is therefore dissipated in an effective manner through the plate 14 and the portion 6 of the body 1 in that there is a substantial subtraction of heat in the duct 2 in the body 1 itself substantial due both to the flow of the air of the heat engine fuel mixture and to the evaporation of the fuel from the surface of the manifold 2 itself.

The advantages obtained with the housing system for a central electronic processing unit formed according to the present invention are apparent from what has been described, in fact the dissipation of heat produced by the component elements of the central processing unit takes place in a very effective manner by the heat removal action exerted by the portion of the fuel mixture induction manifold, and production is particularly simple and therefore economical and it is easy to mount. The springs 13 further guarantee a secure and firm contact of the surface of the board 14 on the surface 7 of the portion 6. Finally, the ordered arrangement of electrical cables 24 coming out of the cover 11 through the combs 32 allows the need for a connector for interconnecting between the external circuit elements and the central processing unit to be eliminated.

Finally, it is clear that the embodiment of the invention described and illustrated can be modified and varied without departing from the scope of the invention itself.

What is claimed is:

1. A housing system for an electronic central processing unit for a heat engine, characterized by the fact that it includes a first part (14) in thermal contact with heat-developing component elements (16) of said central processing unit, said first part being in contact, over at least a substantial part of its surface, with an outer surface (7) of a portion (1) of a fuel mixture induction manifold (2) of said engine, and being further characterized by the absence of any cooling fins on said housing system.

2. A system according to claim 1, characterized by the fact that said portion (1) of said induction manifold (2) houses a butterfly valve (3) therein for regulation of the quantity of inducted mixture.

3. A system according to claim 1, characterized by the fact that said portion (1) of said induction manifold (2) has integrally a lateral part (6) which forms said outer surface (7) on which said first part (14) engages.

4. A system according to claim 3, characterized by the fact that in said lateral part (9) are formed a plurality of cavities (8) perpendicular to said outer surface (7).

5. A system according to claim 1, characterized by the fact that said central processing unit has a cover (11) sealingly fixed against said outer surface (7) of said portion (1) of said induction manifold (2) perimetrically of said first part (14).

6. A system according to claim 5, characterized by the fact that said cover (11) is fixed against said outer surface (7) by means of removable connection members (12) and in that there are provided sealing means for a plurality of apertures in said cover (11) through which the said members (12) pass.

7. A system according to claim 1, characterized by the fact that said component elements (16) of said central processing unit are carried by a circuit board (15) fixed to said first part (14).

8. A system according to claim 1, characterized by the fact that said central processing unit is an electronic central processing unit for at least one of an injection and an ignition system of a motor vehicle heat engine.

9. A housing system for an electronic central processing unit for a heat engine, characterized by the fact that it includes a first part (14) in thermal contact with heat-developing component elements (16) of said central processing unit, said first part being in contact, over at least a substantial part of its surface, with an outer surface (7) of a portion (1) of a fuel mixture induction manifold (2) of said engine, being further characterized by the fact that said central processing unit has a cover (11) sealingly fixed against said outer surface (7) of said portion (1) of said induction manifold (2) perimetrically of said first part (14), and being further characterized by the fact that it includes elastic means (13) for urging said first part (14) into contact with said outer surface (7) of said portion (1) of said induction manifold (2).

10. A system according to claim 9,
characterized by the fact that said elastic urging means comprises coil springs (13) disposed between said cover (11) and said first part (14) around said fixing elements (12) of said cover (11) on said outer surface (7) of said portion (1) of said induction manifold (2).

11. A system according to claim 10, characterized by the fact that it includes means (17) for fixing said component elements (16) of said central processing unit into said cover (11) even with said cover (11) separated from said outer surface (7) of said portion (1) of said induction manifold (12).

12. A system according to claim 11, characterized by the fact that said fixing means (17) includes bushes of plastic material screwed on end sections of said fixing elements (12).

13. A housing system for an electronic central processing unit for a heat engine, characterized by the fact that it includes a first part (14) in thermal contact with heat-developing component elements (16) of said central processing unit, said first part being in contact, over at least a substantial part of its surface, with an outer surface (7) of a portion (1) of a fuel mixture induction manifold (2) of said engine, being further characterized by the fact that said central processing unit has a cover (11) sealingly fixed against said outer surface (7) of said portion (1) of said induction manifold (2) perimetrically of said first part (14), and being further characterized by the fact that it includes means (32, 32', 32") for the ordered positioning of electrical cables (24) for connection between said component elements (16) of said central processing unit and a plurality of external circuit elements.

14. A system according to claim 13, characterized by the fact that said last-mentioned means (32, 32', 32") include at least one pair of combs (32) forming between them cavities (33) for housing said cables (24), at least one of said combs (32) being displaceable with respect to the other for the insertion of said cables (24).

15. A system according to claim 14, characterized by the fact that said displaceable combs (32) include ends housed in guides (31) formed in said cover (11).

16. A system according to claim 15, characterized by the fact that said cover (11) has a chamber (23) for said cables (24) downstream of said combs (32), in which said cables (24) are embedded in an insulating material.

* * * * *